United States Patent [19]

McCuen

[11] Patent Number: 4,929,931
[45] Date of Patent: May 29, 1990

[54] BATTERY MONITOR

[75] Inventor: Steven W. McCuen, Lake Zurich, Ill.

[73] Assignee: Honeywell Inc., Minneapolis, Minn.

[21] Appl. No.: 289,601

[22] Filed: Dec. 22, 1988

[51] Int. Cl.$^5$ .................... G08B 21/00; G01N 27/46
[52] U.S. Cl. .................... 340/636; 340/455;
  340/693; 324/426; 324/427; 324/430; 324/434;
  320/48
[58] Field of Search ............ 340/636, 455, 693;
  364/482, 483; 320/48; 324/426, 427, 430, 434, 433

[56] References Cited

U.S. PATENT DOCUMENTS

| 4,044,300 | 8/1977 | Dupuis | 324/434 |
|---|---|---|---|
| 4,563,628 | 1/1986 | Tietz | 320/48 |
| 4,660,027 | 4/1987 | Davis | 324/433 |
| 4,719,427 | 1/1988 | Morishita | 324/427 |
| 4,761,631 | 8/1988 | Hwang | 340/693 |
| 4,820,966 | 4/1989 | Fridman | 324/434 |
| 4,823,086 | 4/1989 | Whitmire | 324/434 |

FOREIGN PATENT DOCUMENTS 0119547 9/1984 France ................... 324/427

*Primary Examiner*—Joseph A. Orsino
*Assistant Examiner*—Kinfe-Michael Negash
*Attorney, Agent, or Firm*—Donald J. Lenkszus

[57] ABSTRACT

There is disclosed a battery monitor for monitoring a plurality of conditions of a battery utilized within a system as the primary or auxiliary power source of the system. The battery monitor includes a voltage measuring means for measuring the voltage of the battery and a processor coupled to the voltage measuring means. The processor utilizes the voltage measurement of the voltage measuring means to determine the presence or the absence of the battery, whether the battery voltage is equal to or greater than a nominal voltage level, and whether the discharge rate of the battery is greater than a selected discharge rate.

16 Claims, 3 Drawing Sheets

BATTERY MONITOR

BACKGROUND OF THE INVENTION

The present invention generally relates to a battery monitor for testing a plurality of battery conditions at periodic intervals The present invention more particularily relates to a battery monitor for use in a system of the type including a battery as an auxiliary power source and a power supply for providing the primary source of power for the system and for maintaining a charge on the battery. The battery monitor tests for theft of the battery, whether the battery voltage is at least equal to some nominal voltage, and whether the battery discharge rate is greater than a preselected rate.

There are many systems which utilize batteries as primary or auxiliary sources of power. In such systems, it is desirable that the battery or batteries be checked at periodic intervals to confirm that the batteries will perform properly if called upon for delivering power.

One such system, wherein battery monitoring is preferrable is in a fire detection and security alarm system. In systems of this type, it is customary to utilize a power supply which converts AC line current to direct current for providing the primary source of power for the system and to incorporate a battery or batteries which are available as an auxiliary or back-up power source. To insure that the battery or batteries are able to provide sufficient power if called upon, battery monitoring circuits are employed. These circuits test the battery or batteries to determine whether the voltage output of the auxiliary power source is at least equal to some nominal voltage under a preselected load condition.

While such battery monitors have been adequate for the purpose, there remains room for improvement. For example, theft of batteries is not uncommon in security systems. Unfortunately, prior art monitors have provided just one indication whether the battery voltage is normal or low. In such monitors, both a low battery voltage condition and the absence of a battery, due to theft for example, would result in the same indication namely, a low battery voltage indication. Hence, if a low battery voltage indication is present, there is no way of knowing whether the batteries are merely low in charge or whether the batteries are missing altogether.

In addition, the longevity of a battery under load is an important consideration. Monitors of the prior art do not provide for such a measurement. Longeveity is important because if the batteries are to take over the responsibilities of delivering power to the security system, it is helpful to know that the batteries are capable of providing sufficient current under load for some minimum length of time, which is long enough to assure that the AC power will return before the batteries are exhausted. If the batteries fail before AC power is restored, the system will not be functional for a time, leaving the premises to be protected, unprotected.

A further drawback of prior art battery monitors is that they lack flexibility. Such a lack of flexibility renders it impossible to adapt a monitor for a specific application because test parameters, such as voltage test levels, are not readily alterable.

It is therefore a general object of the present invention to provide a new and improved battery monitor for testing the condition of a battery supply at periodic intervals.

It is a more specific object of the present invention to provide a battery monitor which tests for and provides a separate indication of theft of the batteries.

It is a more specific object of the present invention to provide such a battery monitor which further provides a separate test for nominal voltage and a separate indication when the voltage of the batteries is below a nominal voltage.

It is a still further object of the present invention to provide a battery monitor which additionally tests for the discharge rate of the battery and which provides a separate indication when the quality of the batteries is low, because the discharge rate of the batteries exceeds a preselected discharge rate.

It is a still further object of the present invention to provide a battery monitor wherein the test parameters are readily alterable to enable the battery monitor to be adapted for use in a wide variety of applications.

SUMMARY OF THE INVENTION

The present invention therefore provides a battery monitor for monitoring the condition of a battery utilized within a system as the primary or auxiliary power source of the system. The battery monitor includes voltage measuring means for measuring the voltage of the battery and processor means coupled to the voltage measuring means for utilizing the voltage measurement of the voltage measuring means to test the battery. The processor means is arranged, responsive to the voltage measuring means, to determine the presence or absence of the battery, whether the battery voltage is equal to or greater than a nominal voltage level, and the discharge rate of the battery.

The present invention also provides a battery monitor for use in a system of a type including a battery as an auxiliary power source and a power supply for providing the primary source of power for the system and wherein the power supply is connected to the battery for maintaining a charge on the battery. The battery monitor is arranged to test a plurality of battery conditions and includes voltage measuring means for measuring the voltage of the power supply and the battery, means responsive to the voltage measuring means for determining whether the power supply is supplying power to the system, and means for disconnecting the battery from the power supply responsive to a determination that the power supply is supplying power to the system. The battery monitor further includes first means responsive to the voltage measuring means for determining whether the battery is present, said first means including means for comparing the battery voltage to a first predetermined voltage level. The battery monitor additionally includes second means responsive to the first means determining the presence of the battery and also responsive to the voltage measuring means for providing a low battery voltage indication when the battery voltage is less than a second predetermined voltage level, which is greater than the first predetermined voltage level, and third means for determining whether the discharge rate of the battery is greater than a preselected rate.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction with the accompanying drawings, in the several figures of which like reference numerals identify like elements, and wherein:

DESCRIPTION OF THE PREFERRED EMBODIMENT

Figure 1:
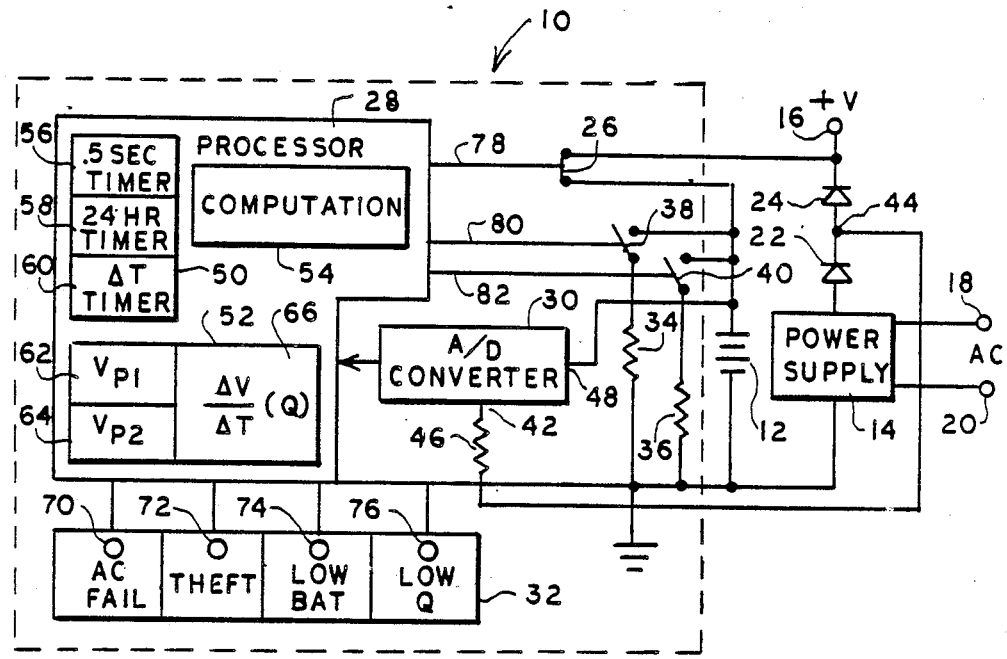
FIG. 1 is a schematic circuit diagram of a battery monitor embodying the present invention.

Referring now to FIG. 1, it illustrates a battery monitor 10 embodying the present invention. In accordance with the present invention, the battery monitor 10 is arranged to test a plurality of conditions of a battery 12. As will be noted from the description of the preferred embodiment hereinafter, the battery monitor of the present invention is adapted to test a plurality of conditions of a battery which serves as either the primary power source of a system or an auxiliary power source of a system. In accordance with this preferred embodiment, the battery 12 serves as an auxilairy power source for a system. To that end, a power supply 14 is provided as the primary source of power for the system to be connected to a terminal 16.

The power supply 14 is coupled to AC line current across a pair of terminals 18 and 20. As well known in the art, such power supplies convert the AC line current to a DC voltage for use by the system which the power supply powers. Hence, power supply 14 is adapted to convert the AC line current applied to terminals 18 and 20 to a DC voltage which is provided at the terminal 16. The power supply 14 also provides charging current to the battery 12. The power supply 14 is coupled to the battery 12 through a pair of diodes 22 and 24 and a normally closed relay 26 as illustrated in the Figure. As will be noted herinafter, when the battery 12 is under test, the relay 26 is opened to disconnect the battery 12 from the power supply 14.

The battery monitor 10 generally includes a processor 28, an analog-to-digital converter 30, a display panel 32, and first and second load resistors 34 and 36 respectively. The battery monitor 10 also includes a pair of normally opened relays 38 and 40 which selectively connect the load resistors 34 and 36 to the battery 12 when the battery 12 is under test.

The analog-to-digital converter 30 serves as a voltage measuring means for measuring the voltage of the power supply 14 and the battery 12. To that end, the input 42 of the analog-to-digital converter 30 is coupled to the common node 44 of the diodes 22 and 24 through a resistor 46. This connection permits the analog-to-digital converter 30 to measure the voltage of the power supply 14. The diodes 22 and 24 isolate the voltage measurement of the power supply from the battery 12 and also provide protection to the system coupled to terminal 16 should the power supply become shorted or otherwise inoperative.

Another input 48 of the analog-to-digital converter 30 is coupled to the battery 12. This connection permits the analog-to-digital converter 30 to measure the voltage of the battery 12 when the battery is under test.

The processor 28 includes a timer section 50, a memory section 52, and a computation section 54. The timer seciton 50 includes a one-half second timer 56, a 24-hour timer 58, and a test time interval timer 60. The memory section 52 includes a section for storing a first predetermined voltage level 62, a section for storing a second predetermined voltage level 64, and a section for storing a preselected discharge rate 66. As will be described hereinafter, the voltage monitor 10 tests the battery 12 to determine a plurality of battery conditions including whether the battery is present or absent, referred to herein as the theft check, whether the battery voltage is equal to or above some nominal voltage, referred to herein as voltage check, and whether the discharge rate of the battery is equal to or less than a selected discharge rate, referred to herein as the quality check. During the theft check, the voltage of the battery 12 is compared to the first predetermined voltage level $V_{p1}$ stored in section 62 of the memory 52. During the voltage check, the voltage of the battery 12 is compared to the second predetermined voltage level $V_{p2}$ stored in section 64 of the memory 52. Lastly, during the quality check, the discharge rate of the battery 12 is compared to the selected discharge rate stored in section 66 of memory 52. In addition, the battery checks are performed in a predetermined sequence, starting with the theft check, then the voltage check if it is determined during the theft check that the battery 12 is present, and then the quality check.

The theft and voltage checks are performed rather frequently for example, twice each second. To that end, the one-half second timer 56 provides the timing interval for initiating the theft and voltage check. The quality check is performed at much less frquent intervals, as for example, once during each 24 hour time period. To that end, the 24-hour timer 58 is checked by the processor each time the theft and voltage checks are performed to determine whether the 24-hour timer has expired.

When the theft and voltage checks are performed, a relatively light load is applied to the battery 12. To provide the light load, the processor causes the normally open relay 38 to close to connect the resistor 34 across the battery 12. In providing the light load the resistor 34 may have a value on the order of 10,000 ohms.

When the quality check is performed, a monitor 10 will apply a relatively heavy load across the battery 12. To accomplish this, the processor will open relay 38 and close relay 40, and connect resistor 36 across battery 12. The value of the resistor 36 to provide the heavy load may be selected to cause the battery 12 to provide current on the order of one ampere. In accordance with this preferred embodiment, nominal voltage of the battery 12 is on the order of 28 volts. As a result, to cause the battery 12 to provide one ampere of current, the value of the resistor 36 should be on the order of 28 ohms.

While a nominal voltage of 28 volts has been selected for the battery 12 in accordance with this preferred embodiment, it will be appreciated that the battery monitor of the present invention is suitable for monitoring batteries of any nominal voltage. In addition, while a single battery 12 is illustrated in the Figure, it will be appreciated that the battery 12 could be a plurality of batteries connected in either series or in parallel without departing from the present invention.

It will also be appreciated that the battery monitor of the present invention can perform tests of battery conditions under a wide variety of test parameters. To change a test parameter, it is only necessary to enter a new parameter into the memory 52 of the processor 28. For example, the first predetermined voltage level stored in memory section 62, the second predetermined voltage level stored in memory section 64, and the selected discharge rate stored in memory section 66, may be readily changed by entering a new value in any one of these memory sections.

To complete the description of the battery monitor 10 illustrated in Figure the display panel 32 includes a plurality of alarm indicators 70, 72, 74, and 76 which may take the form of light emitting diodes, for example. Each of the indicators 70, 72, 74, and 76 is provided to indicate a separate indication. Indicator 70 is provided to indicate if power supply 14 is not supplying power to the system to terminal 16. As indicated in the Figure, this has been identified as an AC fail condition. Before the battery 12 is tested, the battery monitor determines whether there is failure on the part of power supply 14. If there is, the AC fail indicator 70 will turn on and battery 12 will not be tested. The reason that the battery 12 will not be tested is that during the test of the battery 12, the battery is disconnected from the power supply at terminal 16 by the relay 26. If battery 12 were tested during a time when the power supply was inoperative, the opening of relay 26 would remove all power from the system connected to terminal 16. To preclude this possiblility, if the processor determines that there is a power supply failure, it will not disconnect the battery 12 from the terminal 16 and will not conduct the battery test.

The theft indicator 72 is turned on when it is determined by the processor 28 that the battery 12 is not present in the system and has thus been stolen. As will become apparent herinafter, in conducting the theft test the processor compares the battery voltage to the first predetermined voltage level $V_{pl}$ stored in memory section 62. If the voltage of the battery is below the first predetermined voltage level, the processor will indicate that the battery is not present in the system by turning on the theft indicater 72. The first predetermined voltage level is selected at a level which assures that there can be no confusion between a low battery condition and the absence of the battery.

The low battery indicator 74 is turned on if the processor 28 determines that the battery voltage is below the second predetermined voltage level stored in memory seciton 64. The value of the second predetermined a voltage level is selected to be equal to preferred nominal operating voltage of the system. In accordance with this preferred embodiment, the second predetermined voltage level would be on the order of 28 volts. If the processor 28 determines that the battery voltage is less than the second predtremined voltage level, the processor will turn on the low battery indicator 74 indicating this condition. When a system is adapted to function properly for a range of power source voltages, the second predetermined voltage level may be selected at the lower end of the power source voltage range. For example, if the system of the preferred embodiment is capable of operating at a lower range voltage of 26 voltas, the second predetrmined voltage level may be 26 volts.

Lastly, the low Q indicator 76 (low quality) is turned on when the processor determines that the battery discharge rate is greater than a selected discharge rate stored in memory section 66. In conducting this test, which is performed once during each 24-hour time period, the processor 28 takes a first battery voltage reading, starts the time interval timer 60, and after the test time interval timer 60 expires, takes a second voltage reading. Computation section 54 of the processor 28 then divides the change in the battery voltage by the test time interval to determine the discharge rate of the battery. As previously mentioned, during the quality check of the battery, the heavy load resistor 36 is connected across the battery 12. If the determined discharge rate of the battery is greater than selected discharge rate stored in memory section 66, the processor will turn on the low quality indicator 76 indicating that the discharge rate of the battery exceeds the selected rate.

Figure 2:
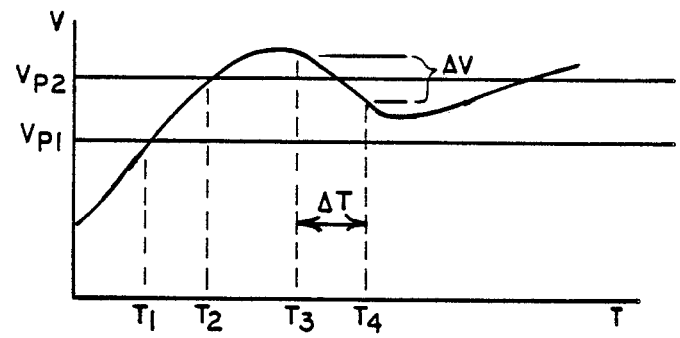
FIG. 2 is a graph illustrating the voltage versus time for a typical battery of a demonstrative system which may utilize a battery monitor embodying, the present invention to advantage; and, FIGS. 2 through 5 are flow charts illustrating the manner in which the battery monitor of FIG. 1 monitors a plurality of conditions of a battery in accordance with the present invention.

Referring now to FIG. 2, it illustrates how the battery voltage may vary over time on the initializing of the system. When the system is first turned on, the battery voltage will be relatively low because the power supply has just begun to charge the battery. Within a short period of time, at $T_1$, the battery voltage will reach the first predetermined voltage level. As the battery voltage increases beyond the predetermined voltage level, the processor will determine that the battery is present in the system. Eventually, at time $T_2$, the battery voltage will reach the second predetermined voltage level which is the nominal operating voltage of the system. When the battery voltage increases beyond the second predetermined voltage level, the processor will determine that low battery condition does not exist. As illustrated at time $T_3$, the monitor begins to test the battery for its discharge rate, and takes its first battery voltage reading at time $T_3$. Also at time $T_3$, the processor will apply the heavy load across the battery to cause the battery to discharge as illustrated. As the battery is being discharged, the voltage of the battery will decrease, and may, as illustrated, decrease to below the second predetermined voltage level. After the test time interval has expired at $T_4$, the processor will take the second voltage reading of the battery. After the second voltage reading is taken, the computation section 54 of the processor 28 will divide the change in the battery voltage by the test time interval and determine the discharge rate or quality of the battery. The processor will then compare the discharge rate of the battery to the selected discharge rate and if the discharge rate of the battery is greater than the selected discharge rate, the processor 28 will turn on the low quality indicator as previously mentioned. When the discharge rate quality check is completed, the processor will remove the heavy load from the battery to permit the battery to once again charge in the positive direction.

Figure 3:
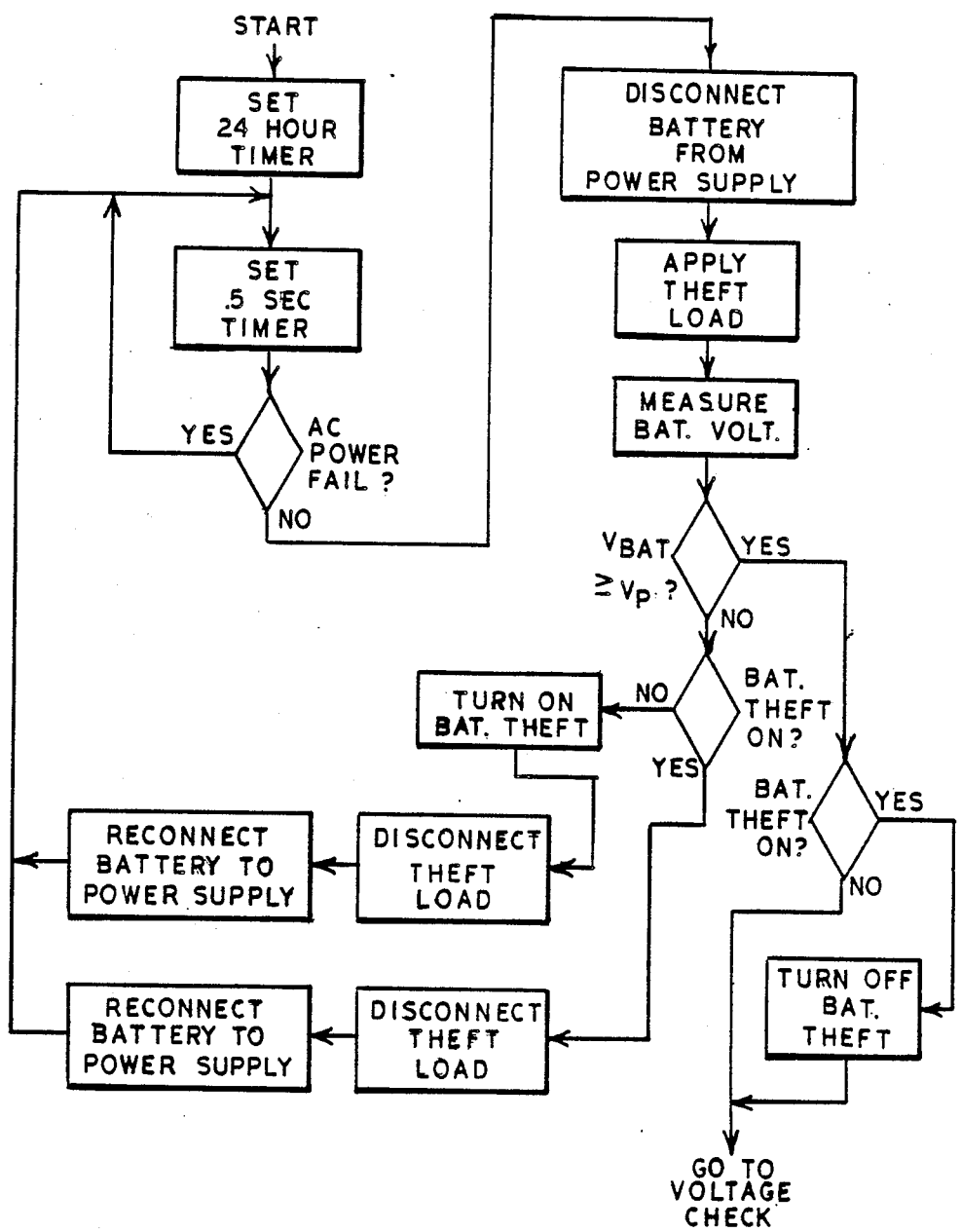
Figures 4, 5:
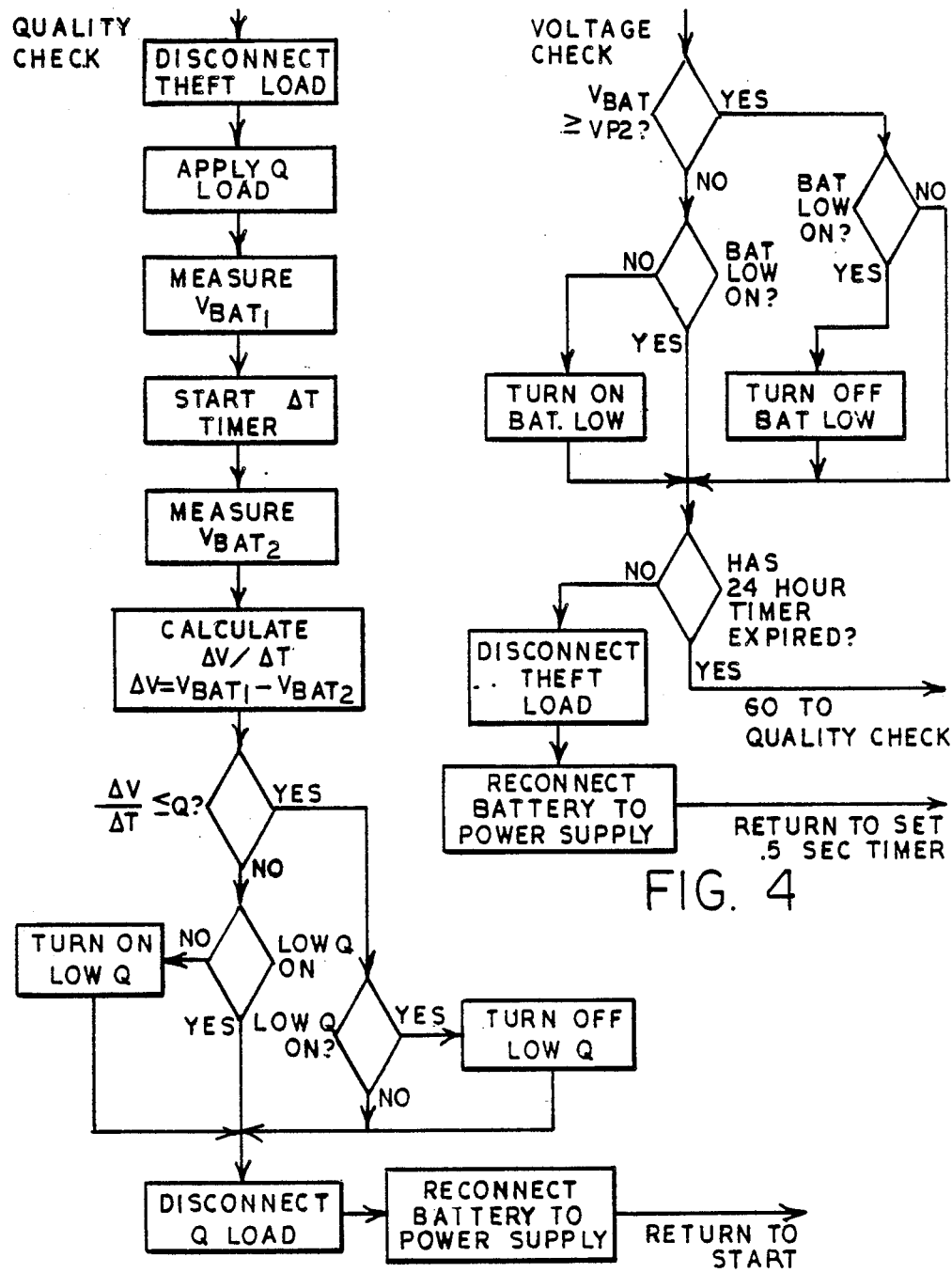

Referring now to the flow charts of FIGS. 3 through 5, they illustrate the manner in which the processor 28 performs the battery tests. The flow charts of FIGS. 3 through 5 illustrate sequences of operation of the processor 28 for each complete battery test cycle.

When the battery monitor first tests the battery, the 24-hour timer is set. Then the one-half second timer is set. When the one-half second timer expires, the processor determines whether there has been an AC power failure. As previously described, the AC power failure may be either an interuption in the AC line current or a malfunction in the power supply 14. Determining whether there has been an AC power failure, analog-to-didgital converter 30 senses the voltge of the power supply at the node 44. If there is adequate voltage at the node 44, the processor 28 determines that there has not been a power failure. If there has been a power failure, the processor will not perform battery checks and will return to reset the one-half second timer.

If there has not been an AC power failure, the processor will disconnect the battery 12 from the power supply 14 by opening the relay 26 over a control line 78. This disconnects the battery 12 from the power supply 14. The processor will then apply the theft load (light load) across the battery 12 by closing relay 38 by a control line 80. The processor will then obtain from the anaolg-to-digital converter 30 the battery voltage measured by the analog-to-digital converter 30. The processor then determines whether the measured battery voltage is greater than or equal to the first predetermined voltage level. If the battery voltage is less than the first predetermined voltage level, indicating that the battery is not present in the system and has thus been stolen, the processor will then determine whether the theft indicator 72 has already been turned on. If the theft indicator 72 has not been turned on, the processor will turn on the theft indicator 72 and disconnect the theft load by opening the relay 38. The processor will also then reconnect the battery to the power supply in the event that the battery 12 is present, but at a very low voltage, and then return to reset the one-half second timer. The relay 26 is closed because if the battery is present but at a very low voltage, there is always the possibility that the battery could be restored to above the first predetermined voltage level.

If the theft indicator 72 is on, the processor will then disconnect the theft load and then reconnect the battery to the power supply, closing relay 26 and then return to reset the one-half second timer.

If the processor determines that the battery voltage is greater than or equal to the first predetermined voltage, it will then determine whether the battery theft indicator 72 is on. If it is on, the processor will turn off the battery theft indicator, then proceed to the voltage check test. If the battery theft indicator 72 was not on, the processor would go directly to the voltage check test.

Upon entering the voltage check test, the processor utilizes the battery voltage reading used during the theft check and determines whether the battery voltge is greater than or equal to the second predetermined voltage level. If it is not, the processor will determine if the low battery indicator 74 is on. If it is not, the processor will turn on the low battery indicator 74. If the low battery indicator 74 was on, the processor will leave the indicator on.

If the processor determines that the battery voltage is greater than or equal to the second predetermined voltage, it then determines if the low battery indicator is on. If the low battery indicator is on, it will turn off the low battery indicator because the battery voltage is greater than the nominal voltage. If the low battery indicator is not on, the processor will alter this condition.

After completing the voltage check, and before entering the quality check, the processor determines whether the 24-hour timer has expired. If the 24-hour timer has not expired, the processor will disconnect the theft load and then reconnect the battery to the power supply. The processor will then return to reset the one-half second timer.

If the 24-hour timer had expired, the processor will enter the quality check by first disconnecting the theft load from the battery and apply the quality check load to the battery through a control 82. The processor then takes its first voltge measurement and then starts the test time interval timer. When the test time interval expires, the processor will take its second voltage reading. After taking the second voltage reading, the computation section 54 of the processor 28 calculates the discharge rate of the battery. If the discharge rate of the battery is not less than the selected rate, indicating that the battery was low in quality, the processor will then detremine whether the low quality indicator 76 is on. If the low quality indicator 76 is not on, the processor will then turn on the low quality indicator. If the low quality indicator is on, the processor will not change this condition.

If the processor determined that the discharge rate of the battery is less than or equal to the selected discharge rate, the processor then determines if the low quality 76 indicator is on. If it is on, it will turn off the low quality indicator 76. If the low quality indicator was not on, it will not change this condition.

After completing the quality check, the processor disconnects quality check load 36 by opening relay 40 through control line 82 and then reconnects the battery 12 to the power supply 14 by closing relay 26. The processor then returns to start and resets the 24-hour timer and then the one-half second timer to begin the test sequence over again.

From the foregoing, it can been seen that the present invention provides a new and improved battery monitor for monitoring the condition of a battery. The battery monitor of the present invention is adapted to test a plurality of conditions of a battery and provides a separate indication with respect to each such condition. Furthermore, the battery monitor of the present invention provides separate and unambiguous indications with respect to theft of the battery and a low battery condition. In addition to the foregoing, the battery monitor of the present invention also tests for the discharge rate of a battery to determine whether the life of a battery is greater than some selected interval. Still further, the battery monitor of the present invention confirms that there is no power supply failure, before conducting the tests on the battery to insure that the system will not be without power due to the testing of the battery. Lastly, the battery monitor of the present invention provides extreme flexibility in that the test parameters can be readily changed by the entering of new test parameters into a memory.

Although a particular embodiment of the present invention has been shown and described, modifications may be made and it is therefore intended in the appended claims to cover all such modifications as may full within the true spirit and scope of the invention.

What is claimed is:
1. A battery monitor for monitoring the condition of a battery utilized within a system as the primary or auxiliary power source of said system, said battery monitor comprising:
voltage measuring means for measuring the voltage of said battery; and
processor means coupled to said voltage measuring means for utilizing the voltage measurement of said voltage measuring means, said processor means being arranged to test said battery by determining responsive to said voltage measuring means, the presence or absence of said battery, whether the battery voltage is equal to or greater than a nominal voltage level, and the discharge rate of said battery, said processor means being adapted to compare said battery voltage to a first predetermined voltage level to determine the presence or absence of said battery, said processor means further being adapted to compare said battery voltage to a second predetermined voltage level to determine whether said battery voltage is equal to or greater than said nominal voltage.

2. A battery monitor as defined in claim 1 wherein said second predetermined voltage level is greater than said first predetermined voltage level.

3. A battery monitor as defined in claim 1 further including means for indicating a low battery voltage alarm condition if said battery voltage is less than said nominal voltage.

4. A battery monitor as defined in claim 1 wherein said processor means is adapted to determine whether said battery is equal to or greater than said nominal voltage only after determining that said battery is present.

5. A battery monitor as defined in claim 1 wherein said processor means is arranged for determining the presence or absence of said battery and whether the battery voltage is equal to or greater than said nominal voltage at a first rate, wherein said processor means is arranged for determining the presence of said battery at a second rate, and wherein said first rate is greater than said second rate.

6. A battery monitor as defined in claim 5 wherein said first rate is on the order of twice per second and wherein said second rate is on the order of once per day 7. A battery monitor for monitoring the condition of a battery utilized within a system as the primary or auxiliary power source of said system, said battery monitor comprising:
voltage measuring means for measuring the voltage of said battery; and
processor means coupled to said voltage measuring means for utilizing the voltage measurement of said voltage measuring means, said processor means being arranged to test said battery by determining responsive to said voltage measuring means, the presence or absence of said battery, whether the battery voltage is equal to or greater than a nominal voltage level, and the discharge rate of said battery said processor means being arranged to determine said battery discharge rate only after determining that said battery is present.

8. A battery monitor for monitoring the condition of a battery utilized within a system as the primary or auxiliary power source of said system, said battery monitor comprising:
voltage measuring means for measuring the voltage of said battery; and
processor means coupled to said voltage measuring means for utilizing the voltage measurement of said voltage measuring means, said processor means being arranged to test said battery by determining responsive to said voltage measuring means the presence or absence of said battery, whether the battery voltage is equal to or greater than an nominal voltage level, and the discharge rate of said battery, said processor means including a memory for storing a test time interval, wherein said processor means further includes means for determining the change in battery voltage during said test time interval, and wherein said processor means further includes means for calculating the rate of change of said battery voltage during said test time interval to determine the discharge rate of said battery.

9. A battery monitor as defined in claim 8 wherein said processor means further includes a memory for storing a selected discharge rate, and wherein said processor means is arranged to provide an alarm indicaiton when said battery discharge rate is greater than said selected discharge rate.

10. A battery monitor as defined in claim 9 wherein said processor means is arranged to compare said battery discharge rate to said selected discharge rate.

11. A battery monitor for monitoring the condition of a battery utilized within a system as the primary or auxiliary power source of said system, said battery monitor comprising:
voltage measuring means for measuring the voltage of said battery;
processor means coupled to said voltage measuring means for utilizing the voltage measurement of said voltage measuring means, said processor means being arranged to test said battery by determining responsive to said voltage measuring means, the presence or absence of said battery, whether the battery voltage is equal to or greater than a nominal voltage level, and the discharge rate of said battery;
a first load;
a second load; and
control means responsive to said processor means for selectively applying said loads to said battery.

12. A battery monitor as defined in claim 11 wherein said processor means is arranged to cause said control means to apply said first load to said battery when determining the presence or absence of said battery, and whether the battery voltage is equal to or greater than said nominal voltage and to cause said control means to apply said second load to said battery when determining the discharge rate of said battery.

13. A battery monitor as defined in claim 12 wherein said first load is greater in resistence than said second load.

14. A battery monitor for monitoring the condition of a battery utilized within a system, said system including a power supply for providing said system with a primary source of power and for maintaining a charge on said battery, said battery monitor comprising:
voltage measuring means for measuring the voltage of said battery;
processor means coupled to said voltage measuring means for utilizing the voltage measurement of said voltage measuring means, said processor means being arranged to test said battery by determining responsive to said voltage measuring means, the presence or absence of said battery, whether the battery voltage is equal to or greater than a nominal voltage level, and the discharge rate of said battery; and
means for disconnecting said battery from said power supply prior to said processor means testing said battery.

15. A battery monitor as defined in claim 14 further including means for testing said power supply for failure and wherein said processor means is arranged to test said battery only after determining an absence of failure of said power supply.

16. A battery monitor for use in a system of the type including a battery as an auxiliary power source and a power supply for providing the primary source of power for the system and wherein said power supply is connected to said battery, for maintaining a charge on said battery, said battery monitor being arranged to test a plurality of battery conditions and comprising:

voltage measuring means for measuring the voltage of said power supply and said battery;

means responsive to said voltage measuring means for determining whether said power supply is supplying power to said system;

means for disconnecting said battery from said power supply responsive to a determination that said power supply is supplying power to said system;

first means responsive to said voltage measuring means for determining whether said battery is present, said first means including means for comparing said battery voltage to a first predetermined voltage level;

second means responsive to said first means determining the presence of said battery and also responsive to said voltage measuring means for providing a low battery voltage indication when said battery voltage is less than a second predeterminied voltage level which is greater than said first predetermined voltage level; and, third means for determining whether the discharge rate of said battery is greater than a selected discharge rate.

* * * * *